(12) United States Patent
Easter

(10) Patent No.: US 7,986,153 B2
(45) Date of Patent: Jul. 26, 2011

(54) METHOD AND APPARATUS FOR SENSING

(75) Inventor: Kevin Mark Easter, Southampton (GB)

(73) Assignee: Atmel Corporation, San Jose, CA (US)

( * ) Notice: Subject to any disclaimer, the term of this patent is extended or adjusted under 35 U.S.C. 154(b) by 283 days.

(21) Appl. No.: 12/395,896

(22) Filed: Mar. 2, 2009

(65) Prior Publication Data
US 2010/0219845 A1 Sep. 2, 2010

(51) Int. Cl.
*G01R 27/26* (2006.01)
(52) U.S. Cl. ...................................................... 324/678
(58) Field of Classification Search .................. None
See application file for complete search history.

(56) References Cited

U.S. PATENT DOCUMENTS

| | | | |
|---|---|---|---|
| 5,730,165 A | 3/1998 | Philipp | |
| 5,757,196 A * | 5/1998 | Wetzel | 324/688 |
| 6,466,036 B1 | 10/2002 | Philipp | |
| 7,088,112 B2 * | 8/2006 | Yakabe | 324/658 |
| 7,107,841 B2 * | 9/2006 | Mori | 73/504.12 |
| 2004/0196617 A1 * | 10/2004 | Mori | 361/280 |
| 2010/0045630 A1 * | 2/2010 | Gu et al. | 345/174 |

* cited by examiner

*Primary Examiner* — Jermele M Hollington
(74) *Attorney, Agent, or Firm* — Baker Botts L.L.P.

(57) ABSTRACT

An apparatus for sensing a change in capacitance of a sensing electrode to a system ground, such as that which may be used to form a touch sensor, with the sensing electrode forming touch sensitive surface is arranged to include a sleep mode of operation. The apparatus includes a sample capacitor having a first terminal coupled to the sensing electrode, and a second terminal coupled to a voltage measurement circuit. The voltage measurement circuit is arranged in operation to determine a voltage at the second terminal of the sample capacitor. A voltage biasing arrangement is arranged under the control of a controller to apply a biasing voltage or the system ground to the first terminal or the second terminal of the sample capacitor in accordance with a measurement cycle.

18 Claims, 12 Drawing Sheets

| Step | S1 | S2 | S3 | P1 | P2 | comment |
|---|---|---|---|---|---|---|
| 1 | 0 | X | X | LOW | LOW | initial reset |
| 2 | X | 0 | 0 | HIGH | V($C_x$) | charge Cs and Cx |
| 3 | 0 | 0 | X | V($C_s$) | LOW | measure V($C_s$) |
| repeat steps 2 and 3 until step n when V($C_s$) exceeds $M_{thresh}$ ||||||||

| Step | S1 | S2 | S3 | S4 | S5 | P1 | P2 | P3 | comment |
|---|---|---|---|---|---|---|---|---|---|
| 1 | X | 0 | 0 | X | 0 | LOW | LOW | LOW | initial reset |
| 2 | 0 | X | 0 | 0 | 0 | HIGH | $V(C_x)$ | $V(C_x)$ | charge Cs and Cx |
| 3 | 0 | 0 | 0 | X | 0 | $V(C_s)$ | LOW | $V(C_x)$ | measure $V(C_s)$ |
| 4 | 0 | 0 | 0 | 0 | X | FLOAT | FLOAT | HIGH | sleep mode |
| repeat steps 2 and 3 until step n when $V(C_s)$ exceeds $M_{thresh}$ ||||||||||

| Step | S1 | S2 | S3 | S4 | S5 | S6 | S7 | S8 | P1 | P2 | P3 | P4 | comment |
|---|---|---|---|---|---|---|---|---|---|---|---|---|---|
| 1 | o | x | o | x | o | x | o | x | LOW | LOW | LOW | LOW | reset |
| 2 | x | o | o | o | o | o | x | o | HIGH | $V(C_{x1})+V_d$ | LOW | HIGH | charge Cs and Cx1 |
| 3 | o | o | o | x | o | x | x | o | $V(C_s)$ | LOW | $V(C_{x1})$ | HIGH | measure $V(C_s)$ and remove charge from Cx1 |
| | | | | | | | | | | | | | repeat steps 2 and 3 until step 1+2n1 when $V(C_s)$ exceeds $M_{thresh}$ |
| 1+2n+1 | o | x | o | x | o | x | o | x | LOW | LOW | LOW | LOW | reset |
| 1+2n+2 | x | o | o | o | x | o | o | o | HIGH | $V(C_{x2})+V_d$ | HIGH | $V(C_{x2})$ | charge Cs and Cx2 |
| 1+2n+3 | o | o | o | x | x | o | o | x | $V(C_s)$ | LOW | HIGH | LOW | measure $V(C_s)$ and remove charge from Cx2 |
| 1+2n+2m+1 | o | x | o | x | x | o | x | o | LOW | LOW | HIGH | HIGH | Sleep mode |
| | | | | | | | | | | | | | repeat steps (1+2n1+2) and (1+2n1+3) until step (1+2n1+3) when $V(C_s)$ exceeds $M_{thresh}$ |

*FIG. 11*

| Step | S1 | S2 | S3 | S4 | P1 | P2 | comment |
|---|---|---|---|---|---|---|---|
| 1 | 0 | X | X | 0 | LOW | LOW | initial reset |
| 2 | X | 0 | 0 | 0 | HIGH | V(C$_x$) | charge Cs and Cx |
| 3 | 0 | 0 | X | 0 | V(C$_s$) | LOW | measure V(C$_s$) |
| 4 | 0 | 0 | 0 | X | FLOAT | HIGH | sleep |
| repeat steps 2 and 3 until step n when V(C$_s$) exceeds M$_{thresh}$ ||||||||

METHOD AND APPARATUS FOR SENSING

FIELD OF THE INVENTION

The present invention relates to apparatus and methods for sensing a change in capacitance of a sensing electrode to a system ground. Embodiments of the present invention can be used to form a touch sensor.

BACKGROUND OF THE INVENTION

Capacitive sensors have recently become increasingly common finding application on a variety of devices for providing touch sensitive switches for activating functions. Capacitive position sensors also find use in non-interface applications, for example detecting fluid levels.

FIG. 1 schematically shows a known type of capacitive sensor 2 which may be operated in accordance with the charge transfer techniques described in U.S. Pat. No. 5,730,165 and/or U.S. Pat. No. 6,466,036. The sensor is for measuring the capacitance Cx of a sense electrode 4 to a system reference potential (ground). The capacitance provided by the sense electrode to the system ground potential may thus be considered as being equivalent to a capacitor having capacitance Cx with one terminal connected to ground, and may be referred to as a sense capacitor.

The sensor 2 may be arranged to detect the presence of a pointing finger 8 adjacent the sense electrode 4, although in other examples the sensor 2 may be used to detect a substance such as a fluid which in some way introduces a grounding effect on the sense electrode 4. When there is no finger adjacent the sense electrode 4 the capacitance formed thereby to ground is relatively small. When there is a finger adjacent the sense electrode 4 (as in FIG. 1), the sense electrode's capacitance to ground is increased as the pointing object provides a capacitive coupling Cx to a virtual ground. Thus changes in the measured capacitance of the sense electrode are indicative of changes in the presence of an adjacent object (e.g. a finger in a touch sensitive control, or a fluid in a level sensor). The sensor of FIG. 1 is a single-channel sensor in that it is operable to measure the capacitance of a single sense electrode 4.

In addition to the sense electrode 4, the sensor 2 comprises a controller 6 and a sample capacitor Cs. The controller 6 is a general purpose programmable device configured to perform a sequence of functions, which control the operation of a biasing arrangement which includes a set of switches, to generate a measure of the capacitance of the sensing electrode Cx to a system reference or ground.

Two pins P1, P2 of the controller 6 may be driven high or low by the biasing arrangement within the controller, in a defined sequence, as the controller executes an operating program. This defined sequence is schematically represented in FIG. 1 by the operation of a series of switches S1, S2, S3, which form the biasing arrangement within the controller 6. Switch S1 selectively connects pin P1 to a logic level +V, which drives the pin P1 high. Switch S2 selectively connects pin P1 to the controller's system reference potential (ground), which corresponds to the action of driving pin P1 low. Only one or other (or neither) of S1 and S2 can be closed at any one instant. Switch S3 similarly drives pin P2 high or floats P2.

The controller is also operable to provide a measurement circuit M connected to pin P1 (i.e. pin P1 is an I/O pin), in addition to being arranged to configure switches S1 and S2 to driven pin P1 high and low. In one example the measurement circuit includes a simple comparator arranged to compare an input voltage on pin P1 with a threshold level $M_{thresh}$. Typically, the threshold level might be half the controller's operating voltage (i.e. $M_{thresh}=+V/2$).

The sample capacitor Cs is connected between pins P1 and P2. The sensing electrode 4 is connected to pin P2.

FIG. 2 shows a table which schematically represents a switch operating sequence of the biasing arrangement of the controller 6 for the touch sensor of FIG. 1 for measuring the capacitance of the sensing electrode 4 to system ground. The sequence operates in a series of steps starting at step 1, as indicated in the left-hand column. The columns headed S1 to S3 indicate the status of the respective switches in each step. An "X" in the table indicates the corresponding switch is closed, while an "O" indicates the corresponding switch is open. The columns headed P1 and P2 indicate the voltage level of the corresponding pins at each step. A table entry "LOW" indicates the corresponding pin is driven low, a table entry "HIGH" indicates the corresponding pin is driven high, where the pin is not driven high or low, its "free" voltage level is indicated. The final column provides brief comments on the step.

Step 1 is an initialisation/reset step. Switches S2 and S4 are closed so that pins P1 and P2 are both driven low. This in effect grounds the sense electrode 4 and shorts out the sample capacitor Cs so that there is no charge residing on either.

Step 2 is a charging step in which only switch S1 is closed. Thus pin P1 is driven high while pin P2 is free to float. The voltage +V provided on pin P1 thus charges the in-series combination of the sample capacitor Cs and the sense capacitor Cx.

The sample capacitor Cs and the sense capacitor Cx provide a capacitive divider between +V and ground. The voltage on pin P2 at the capacitors' common connection is the voltage across Cx (i.e. V(Cx)). This depends on the relative capacitances Cs and Cx. I.e. $V(Cx)=V*Cs/(Cs+Cx)$ in accordance with the well-known capacitor divider relationship. The voltage across the sample capacitor Cs is V(Cs) where $V(Cs)=V-V(Cx)$. I.e. $V(Cs)=V*(Cx/(Cs+Cx))$.

Step 3 is a measuring step in which only switch S3 is closed. Thus pin P1 is free to float and pin P2 is driven low. Driving pin P2 low means (i) the charge on Cx is removed (sunk to ground), and (ii) pin P1 achieves the voltage V(Cs) established across the sample capacitor Cs during the charging step 2. Thus the voltage on pin P1 is $V(Cs)=V*(Cx/(Cs+Cx))$. The voltage on P1 thus depends on the capacitance of the sense capacitor Cx provided by the sense electrode 4. In principle, this voltage may be measured to provide an indication of the capacitance of the sense capacitor. However, in practice the voltage V(Cs) provided by the single charging cycle in step 2 will be small, because the capacitance of the sensing electrode Cx will be very much less than the capacitance of the sampling capacitance Cs. Thus to provide a more robust measure of capacitance Cx the senor 2 is operable to repeatedly execute steps 2 and 3 (i.e. without performing the reset step 1). In each repetition of steps 2 and 3 a discrete increment of charge is added to the sample capacitor. Thus the voltage V(Cs) after each iteration of steps 2 and 3 increases asymptotically in dependence on the magnitude of the sense capacitor Cx. The increase is asymptotic because less charge is added in subsequent iterations because of the charge already on the sample capacitor Cs.

After a number of these charge cycles (i.e. a burst of pulses), the voltage on pin P1 may be measured and taken as an indicator of Cx. However, this requires the measurement channel M of the controller 6 which is associated with pin P1 to have the capability of measuring an analogue voltage. This requires relatively complex circuitry. Thus it is common not to burst for a fixed number of pulses, but to simply keep bursting (i.e. iterating steps 2 and 3) until the voltage V(Cs) reaches a measurement threshold $M_{thresh}$, e.g. where typically $M_{thresh}=V/2$. The number of charging cycles required for the voltage across the sample capacitor Cs to exceed the measurement threshold (as determined by a simple comparator) is an (inverse) measurement of the capacitance to ground of the sense electrode, and hence indicative of the proximity or otherwise of an object. The "variable burst length" scheme has the advantage over "fixed burst length" schemes of using a comparator instead of a more complex voltage measurement function. Nevertheless, both schemes are found to provide robust and reliable measurements of relatively small capacitances.

Although the touch sensor illustrated in FIGS. 1 and 2 operate efficiently to detect the presence of an object, such as a finger, adjacent the sense electrode, there are some circumstances, where two or more such touch sensors may operate in close proximity, which can cause a false detection of an object to be induced.

SUMMARY OF THE INVENTION

According to the present invention there is provided an apparatus for sensing a change in capacitance of a sensing electrode to a system ground. The apparatus may be used to form a touch sensor, with the sensing electrode forming a touch sensitive surface. The apparatus includes a sample capacitor having a first terminal coupled to the sensing electrode, and a second terminal coupled to a voltage measurement circuit. The voltage measurement circuit is arranged in operation to determine a voltage at the second terminal of the sample capacitor. A voltage biasing arrangement is arranged under the control of a controller to apply a biasing voltage or the system ground to the first terminal or the second terminal of the sample capacitor in accordance with a measurement cycle. The measurement cycle includes grounding the first and second terminals of the sample capacitor during an initialization part of the measurement cycle, charging the sensing electrode via the sample capacitor during a charging part of the measurement cycle by applying a drive voltage to the second terminal of the sample capacitor, whilst floating the first terminal by not applying the system ground or a biasing voltage, and during a measurement part of the measurement cycle connecting the first terminal to the system ground whilst floating the second terminal by not applying a system ground or biasing voltage and measuring the voltage at the second terminal, and determining whether there has been a change in capacitance of the sensing electrode in accordance with the measured voltage. The controller is arranged to perform a sleep mode in which the sensing electrode is biased to a voltage which is greater than the system ground, so that the sensing electrode is held at a voltage above the system ground during the sleep mode.

Thus in one example, the second terminal of the sample capacitor is floated by not applying the system ground or a biasing voltage, whilst the first terminal connected to the sensing electrode is held high. In other examples a diode may be connected between the sensing electrode and the first terminal, so that the sensing electrode may be simply biased high.

Whilst the arrangement for sensing a change in capacitance of the sensing electrode described above with reference to FIGS. 1 and 2 provides an efficient and effective way of detecting the presence of a body or a substance, it has been identified that when two touch sensors are disposed near each other to the extent that the charge induced on the sensing electrode of one of the touch sensors can effect the charge induced on the sensing electrode of the other touch sensor, a change in a measured capacitance can result causing a false positive detection of a body or grounding substance proximate the sensing electrode whereas in fact none is present. A technical problem is therefore presented of obviating this false detection problem when two touch sensors are disposed in close proximity.

Embodiments of the present invention address the false detection problem caused when two touch sensors are disposed in close proximity by driving the sensing electrode high by applying a biasing voltage during a sleep mode of operation of the touch sensor. Thus conventionally when the touch sensor is not in a phase of performing a measurement cycle the sensing electrode is grounded. However when a sensing electrode of one touch sensor is disposed in close proximity to the sensing electrode of another touch sensor, the grounding effect during an initialization phase or when a measurement cycle is performed, in steps 1 and 3 in FIG. 2, has an effect of changing the capacitance of the sensing electrode of the other touch sensor, because the grounded sensing electrode appears as a body conducting charge to ground. The controller therefore operates in a sleep mode, which is initiated when, for example an error condition is detected, or a change in capacitance has not been detected for a predetermined time or for some other trigger such as for example if the touch sensor has not been activated.

In one example the error condition may be detected as a result of the sensing electrode receiving a biasing voltage such as might occur if a sensing electrode of another touch sensor is placed in electrical contact with the sensing electrode for which a change in capacitance is being measured. If the sensing electrode of that other touch sensor is in a sleep mode, then the sensing electrode will have a biasing voltage applied thereto and since this is touching the sensing electrode, for which a measurement is being undertaken, then the biasing voltage will be applied to the electrode, thereby further increasing a time taken for the voltage across the sample capacitor to reach a threshold voltage will be longer. This longer time can be detected and used to identify an error condition.

In another example, the sensing electrodes of two touch sensors may be disposed proximate one another, but not touching, so that an electrostatic connection is made without an electrical connection. This might be because the touch sensors each include an insulating layer. As such, when one of the touch sensors enters a sleep mode, and the other touch sensor performs a measurement cycle, the effect on the detection of the change in capacitance on the other touch sensor, is to reduce the capacitance even further. As a result it will be less likely that during a measurement phase in which the sensing electrode of the other touch sensor is grounded, a false triggering of the touch sensor will be caused. Furthermore, as a result of the sleep mode of operation being performed at regular intervals with the measurement cycle there between, a regular pattern of "interference" is caused to the measured voltage across the sample capacitor of the touch sensor, and so a time taken to reach a threshold voltage will vary in a regular predictable way. Since the pattern of interference is regular, the pattern can be filtered by a filtered within the controller and removed from the determination as to whether or not the change in capacitance has been caused by a body proximate the touch sensor.

It will be appreciated that embodiments of the present invention find application with a variety of devices. For example, two similar devices such a mobile phones or PDA's which have a touch sensor may be inadvertently disposed adjacent one another so that there is an electrostatic coupling between the respective sensing electrodes of the touch sensors. A touch sensor embodying the present invention can therefore serve to reduce a likelihood of a false detection. In another example, the touch sensor can be applied to each of a pair of ear phones. In one example, the ear phones are "in-ear" head phones. The ear phones include a touch sensor in order to provide for an activation of a function such as when the ear phones are used in combination with a mobile radio telephone. Thus, whilst the ear phones are in the ear they may be in an active state and therefore expecting to receive a touch from the touch sensor. However, if the ear phones are not in the ear and for example in the pocket of a user then the touch sensors may be disposed adjacent one another thereby creating the false positive detection situation explained above.

Various further aspects and features of the present invention are defined in the appended claims. Further aspects of the invention include pair of ear phones and a method of detecting the presence of a body.

BRIEF DESCRIPTION OF THE DRAWINGS

Embodiments of the present invention will now be described, by way of example only, with reference to the accompanying drawings in which like parts have like reference designations and in which;

FIG. 11 is a table illustrating the operation of the touch sensors shown in FIGS. 4 and 10;

DESCRIPTION OF EXAMPLE EMBODIMENTS

As indicated above the present technique finds application with various devices and more particularly addresses a technical problem caused when a touch sensor on one device is disposed proximate a touch sensor on another device so that the respective sensing electrodes on either device are electrically or electrostatically coupled in some way. As an illustration of one application in which this situation might occur, embodiments of the present invention find application with a set of "in-ear" audio head phones such as those illustrated in FIG. 3.

Figure 3:
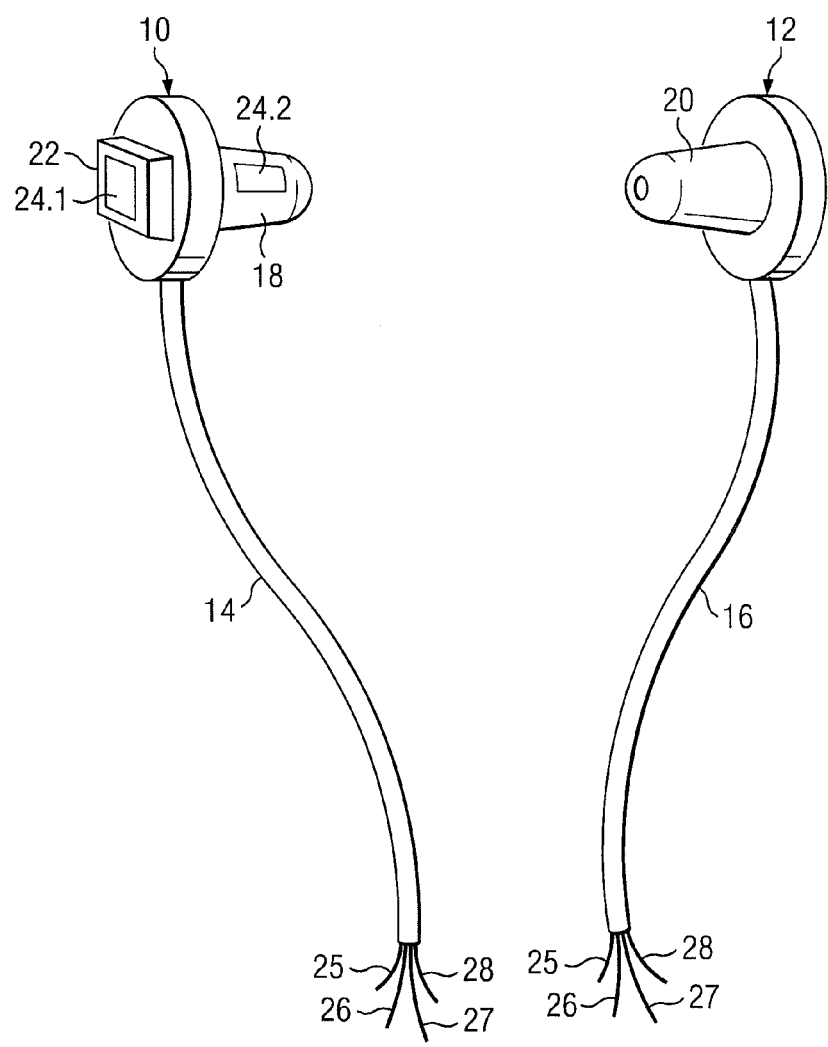
FIG. 3 is a sketched illustration of a pair of "in-ear" audio head phones.

In FIG. 3 a left and right pair of in ear audio head phones 10, 12 are shown with respective connecting cables 14, 16. For this example, two sensors are provided on the head phones. Firstly ear insertion section 18, 20 is arranged to detect when the head phones are disposed in the user's ears. Furthermore, each of the head phones includes a touch sensor on a projecting support section 22 which includes a touch sensing electrode 24.1, with a second touch sensing electrode 24.2 being disposed on the ear insertion section 18. Thus, each of the pair of head phones includes two touch sensors 24.1, 24.2, although in FIG. 3 the two touch sensors can only be seen for the left hand ear phone.

The operation of the present technique will be illustrated with respect to the touch sensor operating with the sensing electrodes 24.1, 24.2 in the following description. Each of the cables 14,16 includes four parallel conductors 25, 26, 27, 28 which provide two lines 25, 26 for power and two lines 27, 28 one of which is provided from the touch sensor 24.1 and the other provided from the second touch sensor 24.2 indicating whether a touch is detected or not detected.

Figure 4:
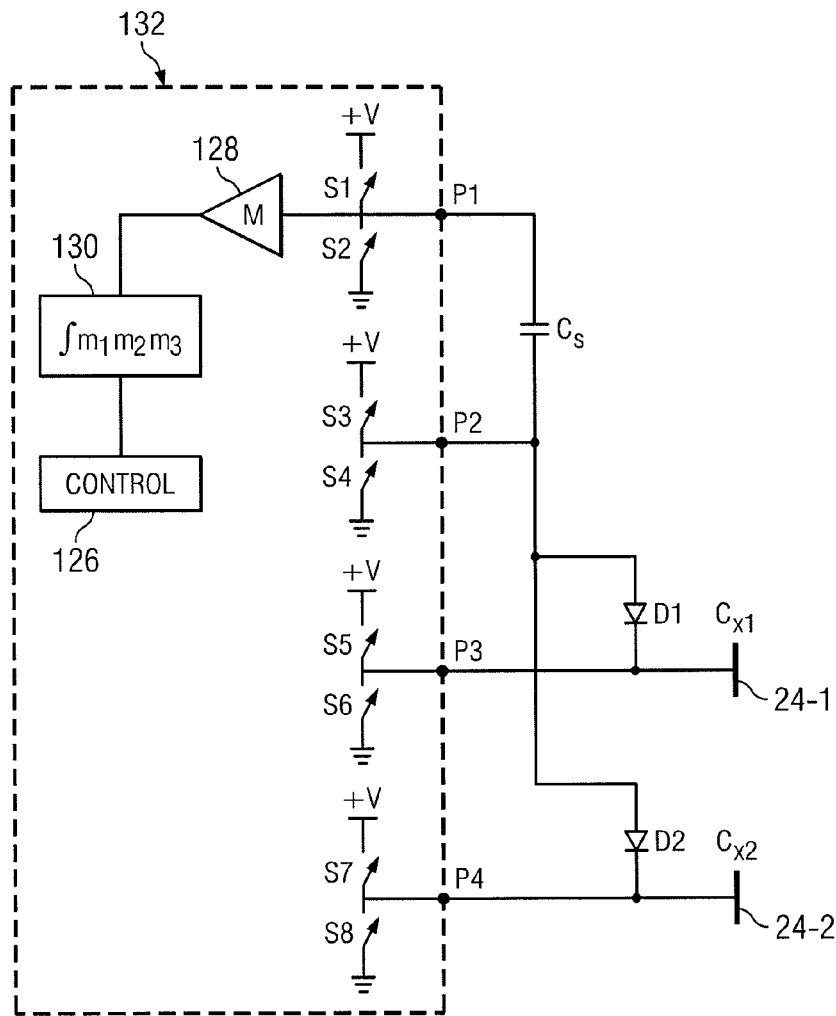
FIG. 4 is an example electrical circuit diagram of one of the touch sensors shown in FIG. 3, providing two touch sensitive electrodes.

An electrical circuit diagram of one the touch sensors providing the sensing electrodes 24.1, 24.2 of one of pair of head phones is shown in FIG. 4.

In order to reduce a number of components required to operate both sensing surfaces 24.1, 24.2 of FIG. 3 and reduce a number of I/O pins required by the touch sensor, a diode D1, D2 is connected between each of the sensing electrodes 24.1, 24.2 and a sample capacitor Cs. The arrangement of the diodes D1, D2 allows a controller 126 of the touch sensor 24.1, 24.2 to detect separately a touch on either of the two sensing electrodes 24.1, 24.2 using the same measurement circuit M 128 and one sample capacitor Cs. As a result of temperature variations, which can cause a drift in a voltage level at which the controller 126 determines that there has been a touch has the same effect of both of the sensing electrodes 24.1, 24.2.

The touch sensor shown in FIG. 4 also includes an integrator 130, which processes a plurality of samples of time to reach a measurement threshold as determined by the measurement circuit 128. The operation of the integrator 130 will be explained in more detail shortly. The measurement circuit 128, the controller 126 and the integrating filter 130, typically would be integrated within a micro-controller 132.

The circuit diagram shown in FIG. 4 operates to detect whether a touch has been made on either of the two sensing electrodes 24.1, 24.2 by performing the measurement cycles explained above with reference to FIGS. 1 and 2, except that when one of the sensing electrodes is not currently being analysed to determine whether there has been a change of capacitance, then one of the switches S5 or S7 is closed, thereby biasing the corresponding sensing electrode 24.1, 24.2 high and correspondingly reverse biasing the diode D1, D2, so that the corresponding one of the sensing electrodes is electrically isolated. A more detailed explanation of the operation of the touch sensors shown in FIG. 4 will be provided shortly.

As will be appreciated, there is no communication between the respective touch sensors on either of the two ear phones 10, 12. Therefore, when the touch sensors are disposed proximate one another which may cause interference between the respective detection processes, as explained below, the interference cannot be removed by communicating an appropriate signal to mitigate the interference from one touch sensor to another.

Figure 5:
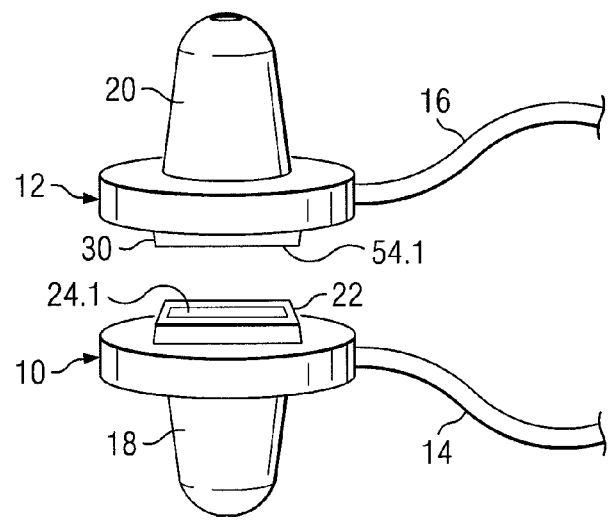
FIG. 5 is a schematic diagram illustrating the ear phones shown in FIG. 3 disposed with respective touch sensors adjacent one another.

For the example of the head phones shown in FIGS. 3 and 4, a situation in which interference might occur is illustrated in FIG. 5.

In FIG. 5 the touch sensitive electrodes 24.1, 54.1 and each of the supporting projections 22, 30 of the head phones shown in FIG. 3 are shown as if they might be disposed if placed in the user's pocket. For the example shown in FIGS. 3 and 5, the sensing electrodes of the touch sensor do not include a protective insulating layer so that the effect of the electrodes touching in FIG. 5 is to electrically connect the sensing electrodes, albeit via a series resistance.

Figures 1, 2:
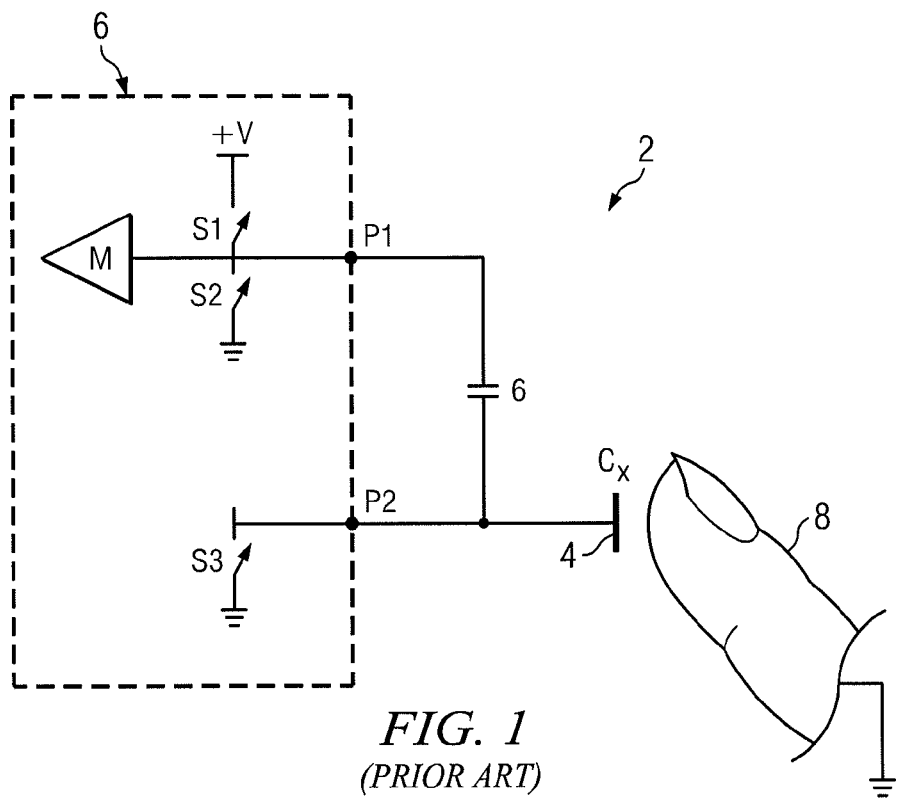
FIG. 1 is a circuit diagram illustrating the operation of a known touch sensor.
FIG. 2 is a table illustrating the connection state of switches shown in FIG. 1 in order to describe the operation of the circuit shown in FIG. 1.
Figure 6:
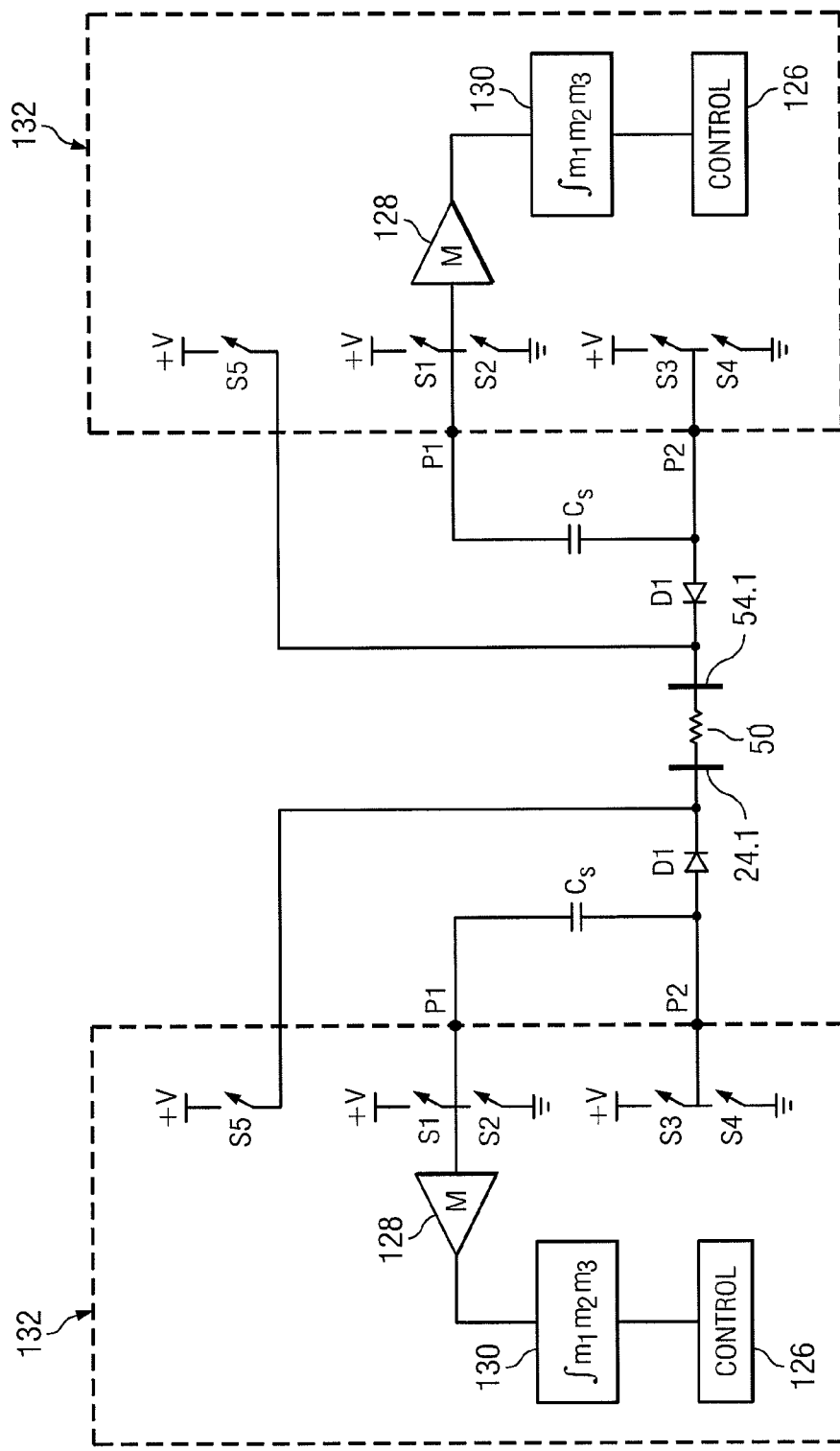
FIG. 6 is a simplified electrical circuit diagram of part of the "in-ear" head phones shown in FIG. 5.

For the arrangement shown in FIG. 5, an equivalent and simplified electrical circuit diagram for one of the sensing electrodes 24.1 is shown in FIG. 6. In FIG. 6, only one of the sensing electrodes 24.1, 54.1 of the touch sensors is shown in order to simplify the explanation of embodiments of the present invention. As shown in FIG. 6, with the sensing electrodes disposed as shown in FIG. 5 a series resistance 50 is shown to connect the sensing electrodes of one of the touch sensors 24.1, with that of the other touch sensors 54.1. As a result of the electrical coupling between the sensing electrodes 24.1, 54.1 on the respective touch sensors, when the sensing electrode is grounded during the initialization phase and during the measurement phase in steps 1 and 3 of FIG. 2, an effect is to increase the capacitance of the other of the sensing electrodes. Thus, if the reset and measurement steps 1 and 3 of FIG. 2 do not coincide exactly, then the amount of charge induced on the sensing electrodes 24.1, and 54.2 will be increased as a result of the other sensing electrode being grounded. This will cause a variation in the time taken for the sample capacitor Cs to reach the threshold voltage. Thus when plotting a time to reach a voltage threshold across the sample capacitor (or counts of a clock cycle) with respect to time, a beat or interference pattern will be produced, as a result of a variation in the measured capacitance. Therefore, as each of the respective controllers 126, 132 cycle through a respective measurement cycle, to determine a length of time before the threshold voltage is reached by the measurement circuit, an amount of time required to reach this predetermined voltage will vary, even when there is no object proximate the sensing electrode. Since the other of the two sensing electrodes is also cycling through a measurement cycle in which the sensing electrode is grounded at various points in the measurement cycle as indicated in FIG. 2, a relative interference between the two touch sensors will cause a count of cycles to reach the measurement threshold to vary as function of the phase difference between the respective measurement cycles for each of the two circuits. A graphical representation of counts with respect to time of such a situation, as illustrated in FIG. 6, is shown in FIGS. 7a and 7b.

Figure 7A:
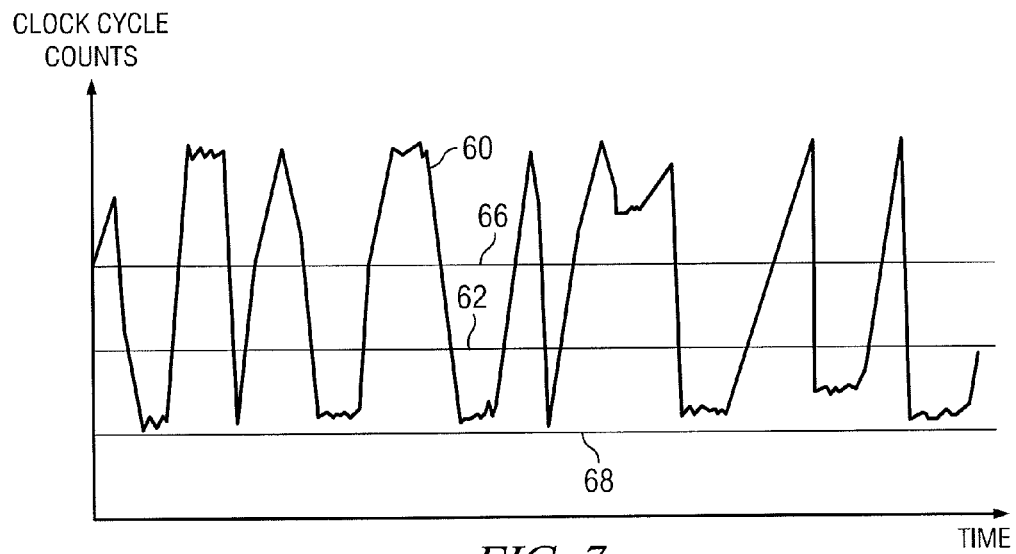
FIG. 7a is a graphical representation of a plot of clock cycle counts or time taken to reach a predetermined threshold voltage of the sample capacitor of the touch sensor shown in FIG. 6, during an "interference condition", without benefiting from the present technique
Figure 7B:
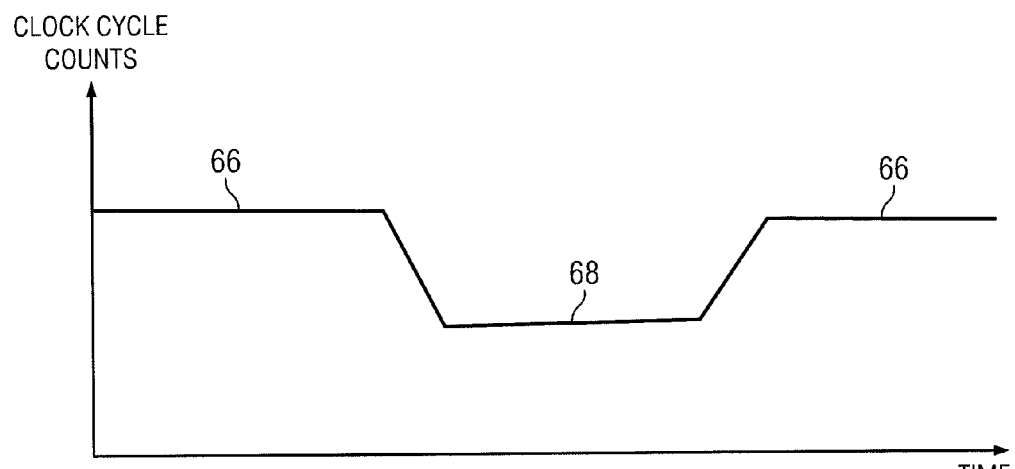
FIG. 7b is a graphical representation of a plot of clock cycle counts to reach the threshold voltage of the sample capacitor for one of the sensing electrodes of the touch sensor shown in FIG. 4 during a normal "in-ear" operation.

In FIG. 7a a plot 60 provides a graphical illustration of a plot of clock cycle counts with respect to time for one of the sensing electrode 24.1 of the touch sensor shown in FIG. 6. FIG. 7b shows an example plot of a count of clock cycles or time to reach a threshold voltage with respect to time for one of the touch sensors of FIGS. 4 and 6, when disposed in a user's ear. A first line 66 corresponds to a situation in which the touch sensor 24.1 is not touched, whereas a section 68 provides an example of the signal when the touch sensor is touched. In contrast, the line 60 shown in FIG. 7a illustrates the count of clock cycles with respect to time when the touch sensors are disposed as shown in FIGS. 5 and 6. A solid line 62 shows the expected value in clock cycle counts with respect to time of a threshold value, below which would normally be regarded as a positively detected touch. Thus as can be seen as a result of the presence of the other touch sensor, there is a variation of counts with respect to time which can result in the number of counts falling below a threshold 62, which would normally be associated with the touch sensor being touched by a body such as the user's finger. Therefore embodiments of the present invention seek to address and reduce a likelihood of such false indications of the presence of a body proximate touch sensor.

The circuit diagram shown in FIG. 6 can be adapted in operation in accordance with the present technique to reduce a likelihood of a false triggering of a touch sensor as a result a situation in which another touch sensor is disposed proximate the touch sensor as for example illustrated in FIG. 5. As explained above, during the initialisation phase and the measurement phase the sensing electrode is grounded and generally known arrangements for measuring the capacitance of sensing electrodes, ground the sensing electrode when not in use so that there is no residual charge. However, as indicated above, when the sensing electrodes are disposed proximate one another, or as for the example shown in FIG. 5, the sensing electrodes touch, and the grounding effect causes the interference pattern of FIG. 7a, which can cause a false positive detection, because the plot of clock cycles with respect to time stays below the detection threshold for a significant amount of time.

In accordance with the present technique, a touch sensor embodying the present invention is arranged to enter a sleep mode, when the touch sensor is in-active or when an error condition is detected. In one example, an in-active state may be detected as a result of a positive detection not being detected for a predetermined non-activity time. In accordance with the present technique, when the touch sensor enters the sleep mode, the sensing electrodes are biased high rather than low as with a conventional arrangement. Thus for the simplified example shown in FIG. 6, during the sleep mode, the switch S5 is closed and all other switches are open thereby biasing the sensing electrodes 24.1, 54.1 high.

As will be appreciated, although the reference voltage +V is provided, any voltage can be used which does not have to be the same voltage as that used to drive charge onto the sample capacitor and the sensing electrode 24.

Generally the effect of connecting the sensing electrode to the positive biasing voltage V by closing switch S5 is to bias the sensing electrode high. Thus, if that sensing electrode is disposed proximate the sensing electrode of the other touch sensor, which is performing a measurement cycle, then the effect will be to reduce the capacitance of the sensing electrode, of that other touch sensor, increasing the time taken to reach the threshold voltage, if the sensing electrode is not touching the other sensing electrode. However for the example shown in FIG. 5, if the sensing electrodes 24.1, 54.1 are touching, the effect is that when a sensing electrode 24.1 is being analysed by the touch sensor, that the sensing electrode 24.1 is biased high by the sensing electrode of the other touch sensor in the sleep mode via the series resistor 50. As such a rate at which charge can be driven onto the sensing electrode 24.1 under test is reduced substantially, thereby increasing a time taken for the voltage across the sample capacitor Cs to reach the threshold voltage from a mean value which would normally be expected without a touch being present. Thus, by setting a threshold time in clock cycles, which is above the normal "no touch" and positive "touch" values, an error state can be detected and used to set the touch sensor into the sleep mode. The operation of one of the touch sensors shown in FIG. 6 is illustrated by the table in FIG. 8. The table in FIG. 8 corresponds substantially to the table shown in FIG. 2. However, in FIG. 8 there is a fourth step and each of the steps shows the state of the fifth switch in FIG. 4 S5. The fourth step shown in FIG. 8 (step 4) corresponds to a "sleep mode", which the touch sensor may enter for example when the error state is detected as mentioned above or when no change in capacitances corresponding to the presence of any body proximate the touch sensor has occurred for more than a predetermined time. Thus, if in the sleep mode, instead of cycling through steps 2 and 3 the controller proceeds to step 4 in which switches S1, S2, S3 and S4 are opened. Thus at that point the terminal P1 of the sample capacitor is floated in the sense that no biasing voltage or ground is applied to that terminal. The terminal is therefore allowed to acquire a voltage bias naturally with respect to other components in the touch sensor. However, in step 4, switch S5 is closed biasing the sensing electrode 24.1 to the biasing voltage plus V. The touch sensor remains in the sleep state for a predetermined time after which processing proceeds to step 1 and the touch sensor is again initialized and then processing steps 2 and 3 are performed to measure a time taken for the voltage across the sample capacitor Cs to reach a predetermined threshold voltage.

Figures 8, 9:
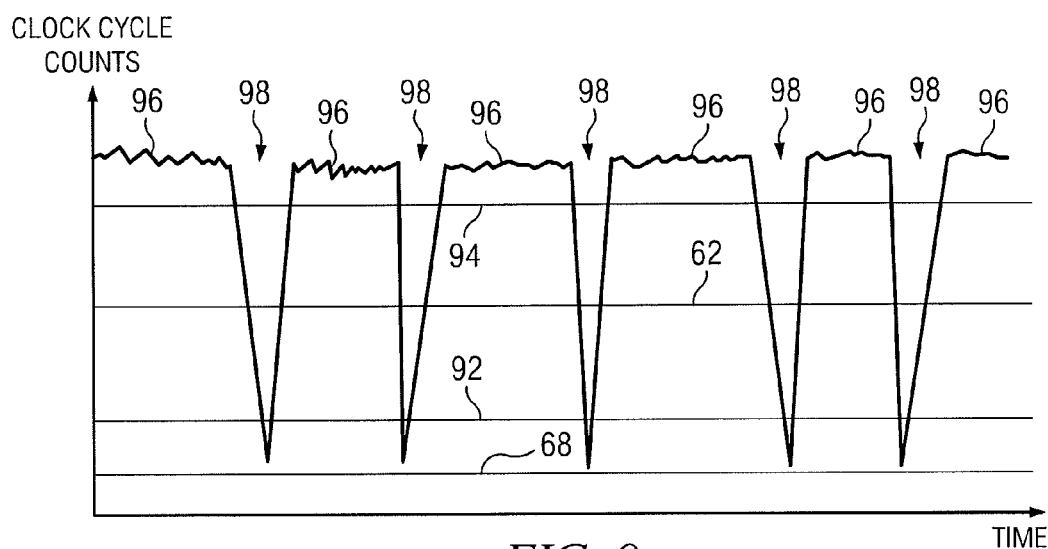
FIG. 8 is a table illustrating the operation of one of the touch sensor shown in FIG. 6, when operating in accordance with the present technique.
FIG. 9 is a graphical representation of a plot of counts with respect to time for the touch sensor shown in FIGS. 4 and 6, which operating in accordance with the present technique.

The effect of the operation of the touch sensor in accordance with the present technique illustrated in FIGS. 6 and 7 is illustrated in FIG. 9 which provides a corresponding graphical representation of a plot of count with respect to time corresponding to that shown in FIGS. 7a and 7b. As can be seen in FIG. 9, the level of the number of counts required to reach the same predetermined voltage has increased with respect to the example shown in FIGS. 7a and 7b. Thus the plot in FIG. 9 corresponds to the number of counts for a touch sensor when another touch sensor is disposed to touch the sensing electrode of the touch sensor as shown in FIGS. 5 and 6 and is biased to a positive voltage V as it would be when the touch sensor is in the sleep mode in step four shown in FIG. 8. As explained above, a result of the presence of the positive voltage on the other sensing electrode, biases the sensing electrode of the touch sensor under test to a voltage which substantially reduces an amount of charge which can be driven on to that touch sensor and therefore a time taken for the charge across the sample capacitance Cs to reach the threshold voltage increases. Thus the plot 90 is raised with respect to the mean value 62 shown in FIGS. 7a and 7b. Also shown in FIG. 9 is a line 92 represents a time to reach the threshold voltage, which would be regarded as a positive detection. Also shown is a second line 94 indicating a time to reach the threshold voltage of the plot 90, which would correspond to an error condition, such as that when the sensing electrode 54.1 of the other touch sensor is high, when that other touch sensor is in the sleep mode.

As can be seen the plot 90 includes sections 96 in which the time to reach the threshold voltage is significantly above the mean value and this corresponds to a state in which the other sensing electrode 54.1 is high in sleep mode. As such, by setting a threshold 94, which would correspond to a detected state in which the sensing electrode is touching another sensing electrode which is high, an error state can be identified and can be used to put that touch sensor into the sleep mode.

A third line 68 indicates a time to reach the threshold voltage, which is produced when a touch has been applied to the touch sensor 24.1, which is the same value of that shown in FIGS. 7a and 7b.

As indicated above, the plot 90 for the touch sensor, which is in sleep mode includes periodic dips 98, between the sections 96, which correspond to times when the other touch sensor which has the sensing electrode 54.1 touching the sensing electrode for which the plot 90 has been generated, comes out of sleep mode and performs a measurement cycle. As can be seen these dips 98 fall below the threshold 92, which would be regarded as a positive detection and therefore could represent a false detection. However, the integrator 130 shown in FIGS. 4 and 6 is arranged to sum the values of the samples from the plot 90 for a predetermined number of samples, so that if the dips 98 do not remain below the threshold 92 for longer than this predetermined number of samples, then the dips 98 will not be regarded as a detection. Therefore, by biasing the sensing electrode high during sleep mode and filtering the detection results generated by the measurement cycle, a likelihood of false detection, if another touch sensor is disposed so that the sensing electrodes touch, is avoided or at least substantially reduced.

In other examples a filter can be used instead of the integrator 128 to remove the dips 98 in the counts from the detection of a touch, and thereby reduce a likelihood of a false detection.

More Detailed Illustration

A sequence of operations illustrating the opening and closing of the switches of the diagram shown in FIG. 4 is shown in FIGS. 10A, 10B, 10C, 10D, 10E and 10F. Furthermore a table illustrating the operation of the controller for the touch sensor shown in FIG. 4 is shown in FIG. 11 which corresponds substantially to the operation of the circuit shown in FIG. 4 as illustrated in FIG. 8, and so will be only briefly described here.

Figure 10B:
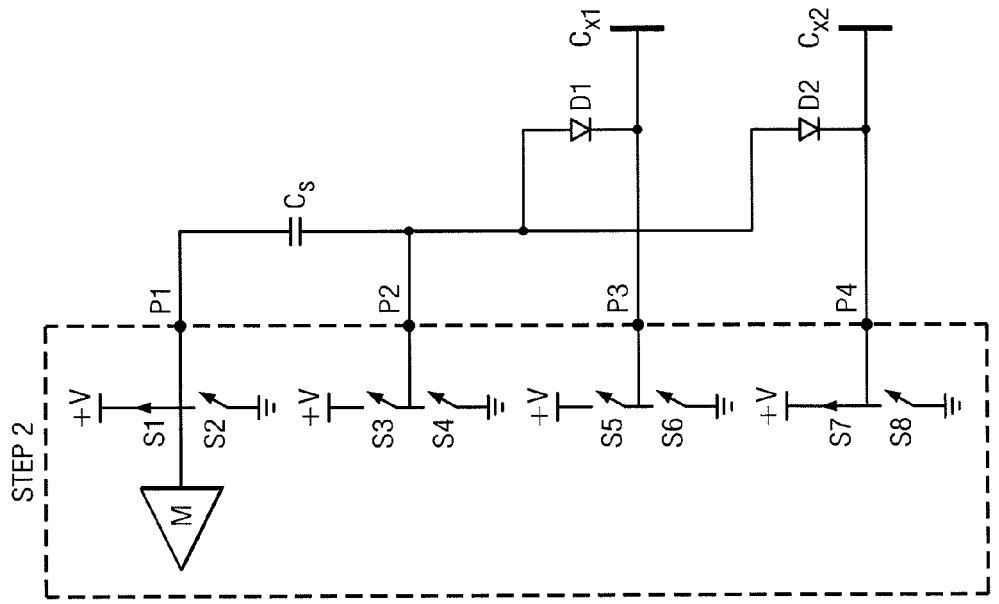
FIGS. 10A, 10B, 10C, 10D, 10E and 10F shows various states of the switches of the circuit diagram shown in FIG. 4 when operating in accordance with the present technique.
Figure 10A:
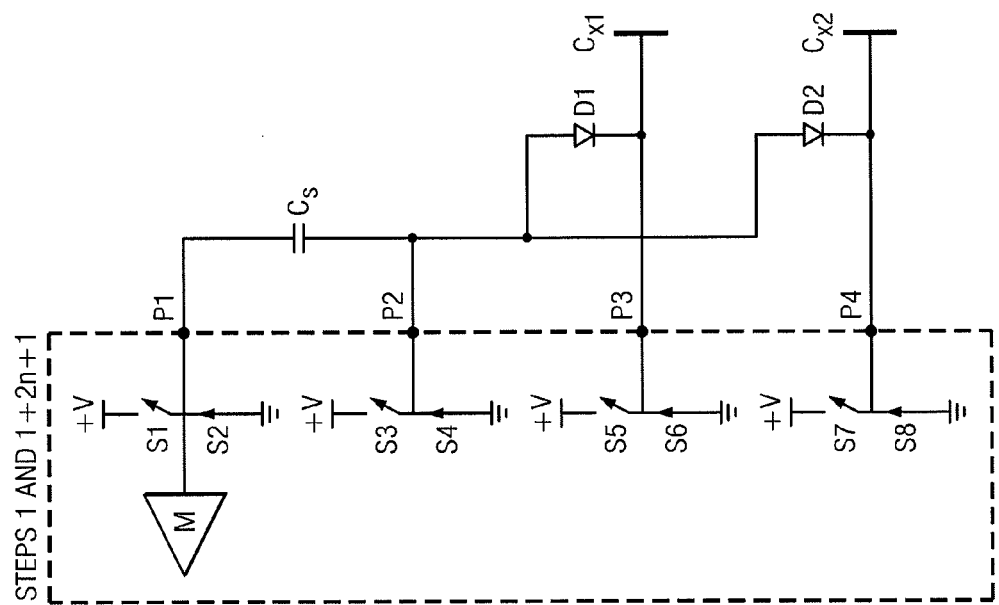
Figure 10D:
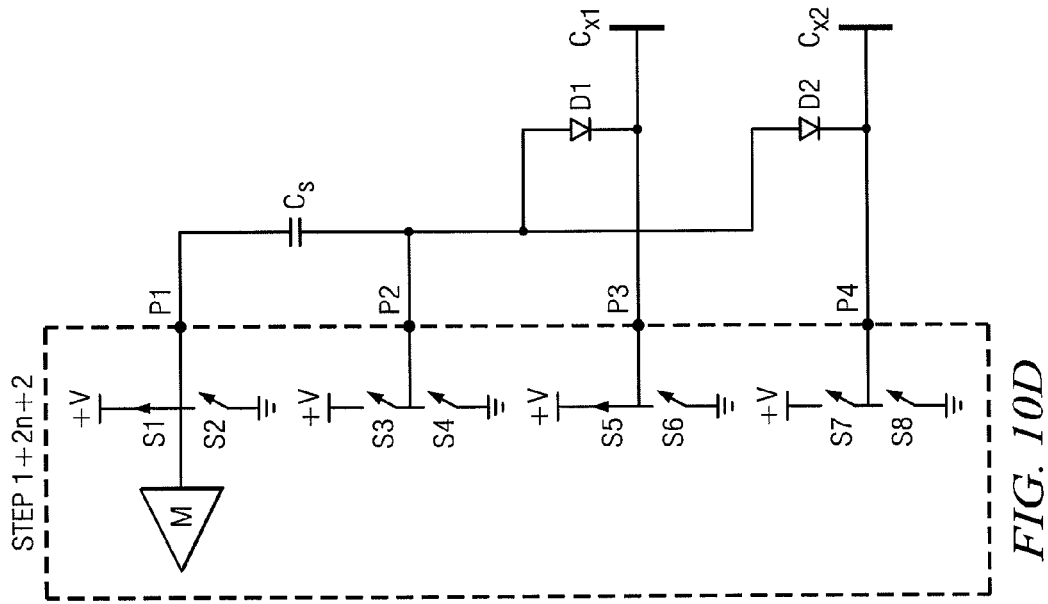
Figure 10C:
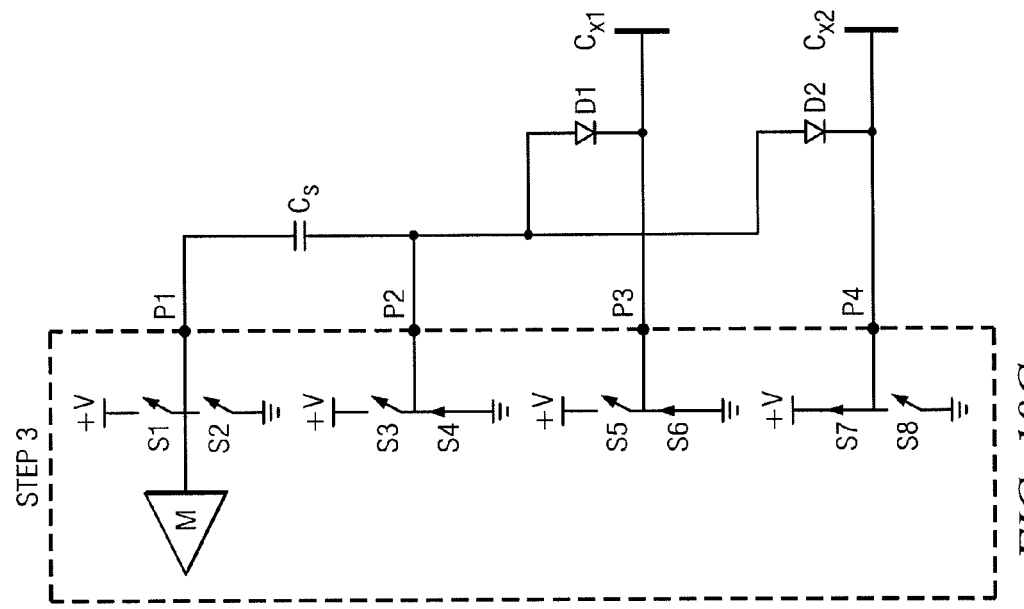

Step 1 shown in FIG. 10A, corresponds to an initialisation step in which the sensing electrodes 124.1, 124.2 are grounded. Steps 2 and 3 illustrated in FIGS. 10A and 10B are part of a measurement cycle which detects a change in capacitance of the first touch sensor 124.1, using the measurement circuit M and the sample capacitor Cx as explained above for the example touch sensors illustrated in FIGS. 1, 2, 4, 6 and 8. In order to charge the sample capacitor to reach the threshold voltage then steps 2 and 3 are repeated. The number of repetitions of steps 2 and 3 are assumed to be n in FIGS. 10A, 10D, 10E and 10F. As shown in FIGS. 10B and 10C, during this part of the measurement cycle, the sensing electrode of the second touch sensor 124.2 is held high, which prevents the diode D2 from conducting and therefore does not affect the measurement of the capacitance with respect to the first sensing electrode. Correspondingly, after performing an initialisation step 1+2n+1, steps 1+2n+2 and 1+2n+3 shown in FIGS. 10D and 10E perform a measurement cycle for determining the capacitance of the second sensing electrode 124.2, whilst the first sensing electrode is held high, so that the first diode D1 does not conduct and therefore the capacitance of the first sensing electrode does not interfere with the capacitance of the second sensing electrode 124.2. As for the first sensing electrode 124.2, steps 1+2n+2 and 1+2n+3 are repeated until the threshold voltage is reached. The repeated steps are represented as m.

Figure 10F:
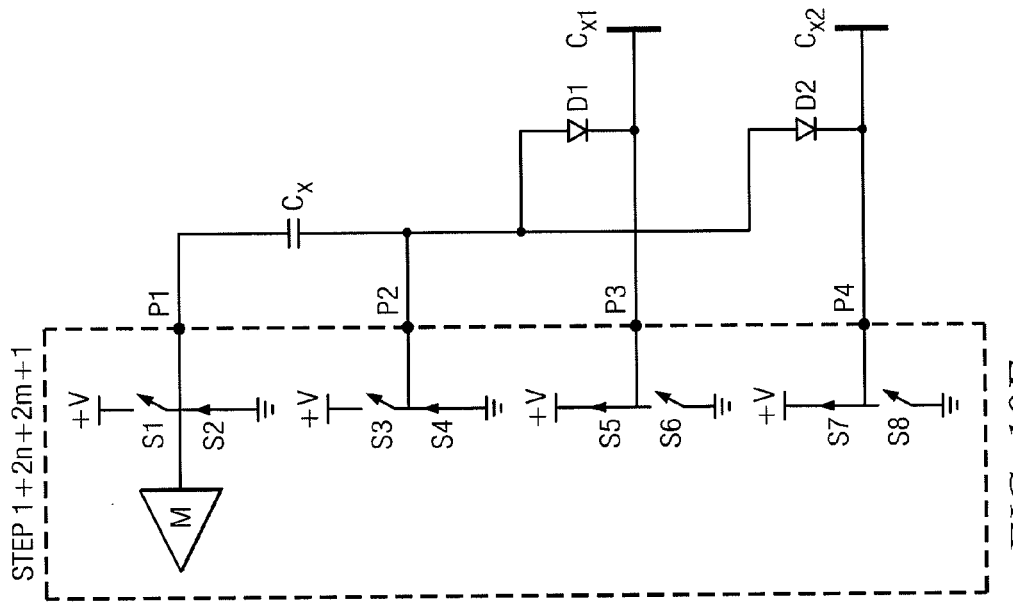
Figure 10E:
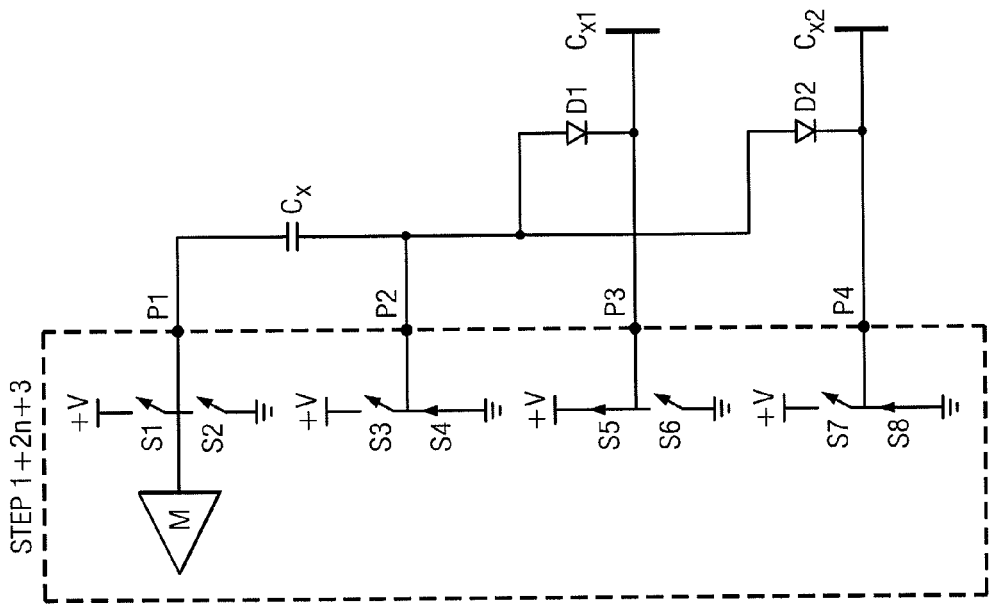

In the final step 1+2n+2m+1, shown in FIG. 10F, the controller enters a sleep mode as for the above embodiments and both the sensing electrodes 124.1, 124.2 are held high as for the examples illustrated in FIGS. 4, 6 and 8. As shown in FIG. 10F and FIG. 11 in the sleep mode, the switches are all open except switches 5 and 7, which are closed thereby biasing the sensing electrode to be positive voltage +V.

Figure 12:
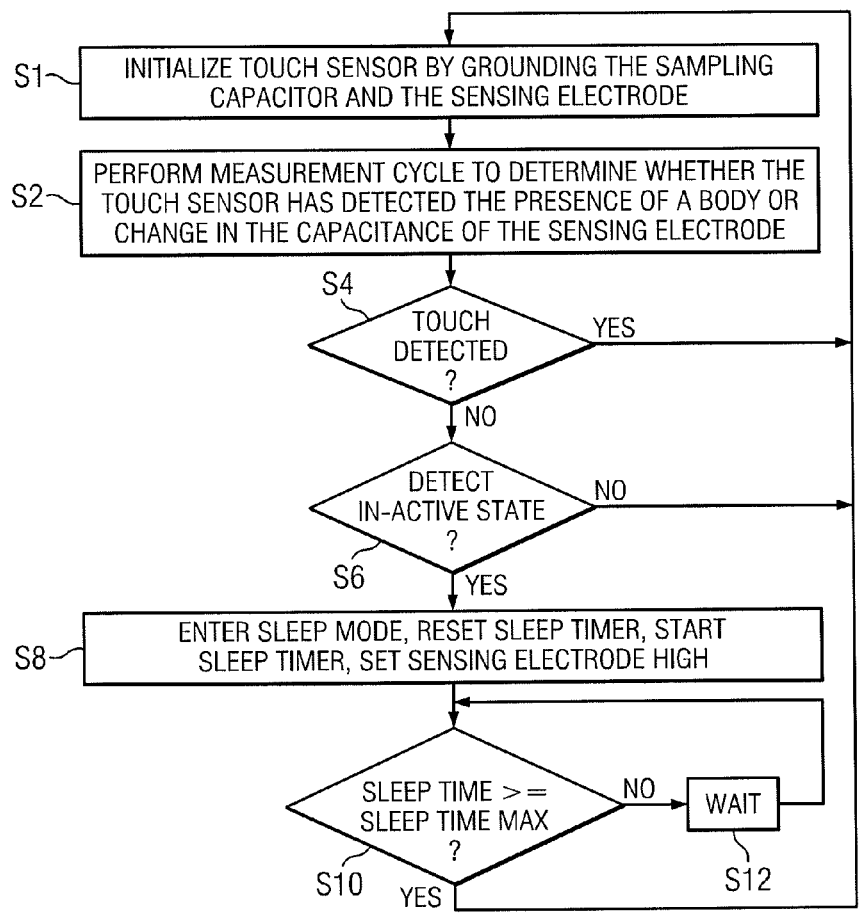
FIG. 12 is an illustrative flow diagram explaining the operation of a touch sensor in accordance with the present technique.

FIG. 12 provides one example of the operation of the controller of the touch sensor according to an embodiment of the invention shown in either of FIGS. 4, 6, 8, 10 and 11. FIG. 12 illustrates an example in which the touch sensor is arranged to detect an in-active state, for example, if the number of clock cycles taken to reach the threshold voltage exceeds that error threshold such as would be the case for the example of FIG. 4 contacting the sensing electrode of another touch sensor. FIG. 12 is summarised as follows;

S1: The touch sensor begins its measuring phase by initialising, which includes grounding the sample capacitor and the sensing electrode.

S2: The touch sensor performs the remaining parts of the measurement cycle and determines whether the touch sensor has detected the presence of a body or change of capacitance of the sensing electrode in accordance with steps 2 and 3 of the example illustrated in FIGS. 8 and 11.

S4: At a decision point S4, it is determined whether a touch has been detected. If a touch has been detected then processing passes to step S1 and thereafter the measurement cycles are performed in order to detect whether a body is present proximate the sensing electrode.

S6: If a touch has not been detected then at decision point S6 it is determined whether the touch sensor is in-active. This could be determined using an activity timer, which is started when the last positive touch has been detected and then used to determine a no-activity state if no touch has been detected for a predetermined no-activity time. Alternatively, for the example mentioned above, an increase of the time to reach the predetermined threshold voltage, can be determined as an error signal as a result of two sensing electrodes touching. If it is determined that the touch sensor is active, then the processing loops back to process step S1.

S8: If the controller determined that the touch sensor is in the in-active state then the touch sensor enters a sleep mode in which a sleep timer is reset and started and the sensing electrode of the touch sensor is set high by connecting the touch sensor to a reference voltage.

S10: At decision point S10 it is determined whether or not the sleep timer is greater than or equal to a maximum sleep time. If it is not then the processing loops back to step S10 via a wait state S12. If the sleep timer is greater than or equal to the maximum sleep time then processing loops back to reset the active timer in step S1 and the process repeats.

As an alternative method of detecting an inactive state of the touch sensor or a device in which the touch sensor is embodied, a controller may use a second switch to determine whether the device is in an active state. In this example, which might correspond to the example embodiment shown in FIGS. 3 and 5, the second sensing electrode is provided to form a second touch sensor, which could correspond to the outer casing of the ear phone of FIG. 3, which would determine whether or not the ear phone is disposed in the user's ear or not. If a touch is sensed then the controller could conclude that the touch sensor is active. If not then the touch sensor could conclude that the device is inactive.

OTHER EXAMPLES

Figure 13:
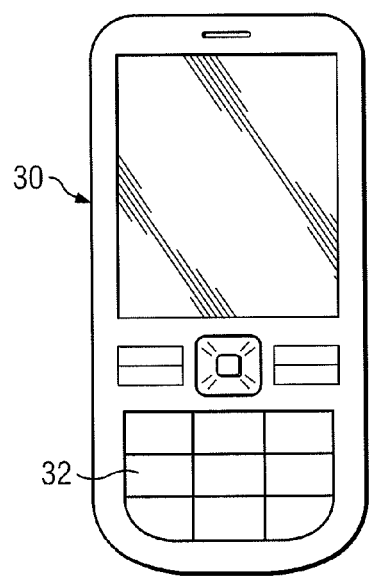
FIG. 13 is a schematic representation of a mobile telephone.
Figure 14:
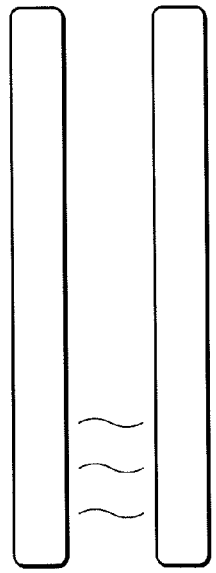
FIG. 14 is a schematic representation of two of the mobile telephones shown in FIG. 13 disposed adjacent one another.
Figures 15, 16:
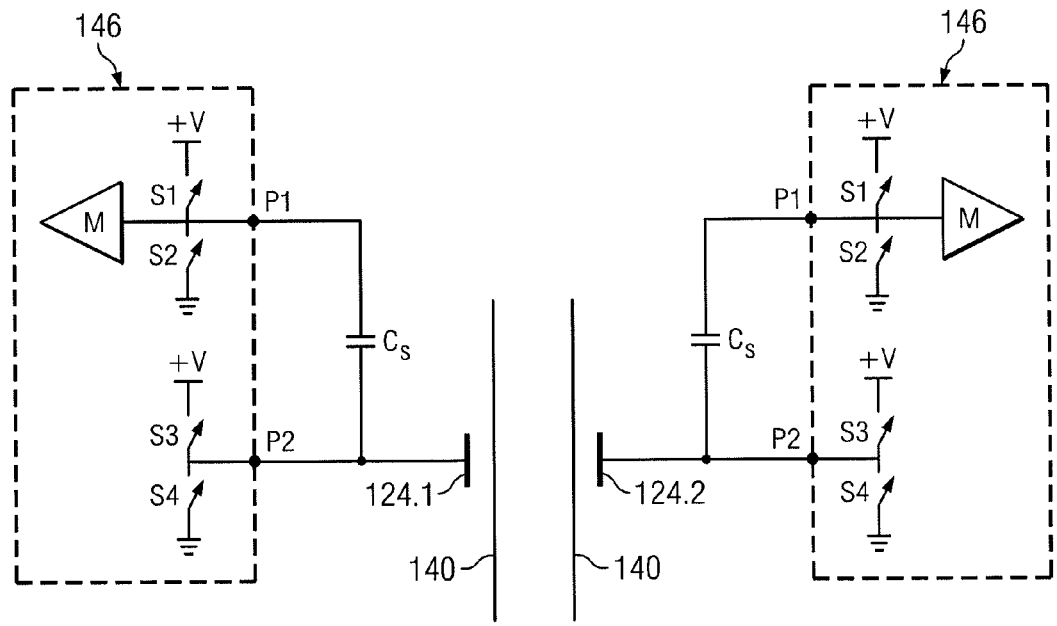
FIG. 15 is an electrical circuit diagram of two example touch sensors embodied in the mobile communications devices of FIG. 14.
FIG. 16 is a table illustrating the operation of the touch sensors shown in FIG. 15 according to the present technique.

Another example, in which interference can occur between touch sensors is illustrated in FIGS. 13, 14 and 15. In FIG. 13, a mobile communications device 30, such as a mobile telephone or a personal digital assistant includes a touch sensitive control panel 32, having one or two touch sensors disposed behind a protective layer or screen 140, which may serve to electrically isolate sensing electrodes of the touch sensors. As shown in FIG. 14, if two independently operating mobile communications devices are disposed proximate one another then the sensing electrodes may interfere with one another as a result of an electrostatic coupling between the touch sensors. An equivalent circuit diagram for this situation is shown in FIG. 15.

The example shown in FIG. 15 corresponds substantially to the example shown in FIGS. 1 and 2, so that only the differences will be described. As will be appreciated, for the reasons given above, an effect of the insulation layer 140 is to provide an electrostatic coupling, rather than the electrical coupling which is caused for the example shown in FIG. 5. However, as for the examples shown in FIGS. 5 and 6, an effect of the measurement cycle would be to increase the capacitance of the sensing electrode, thereby causing a false positive detection as for the examples given above. Accordingly, the operation of the controller 146 for the touch sensor shown in FIG. 15 is shown in FIG. 16, which includes a sleep mode, in which the sensing electrode is drive High between measurement cycles.

As mentioned above, if it were possible to connect a communications channel between the two touch sensors, it would be possible to mitigate the effect of the other touch sensor by either synchronising the measurement cycles or introducing another measure such as increasing the threshold voltage required to detect the presence of a body. Furthermore, because the touch sensor is disposed in a position where it is necessary to measure the presence of a touch from a change in the time to reach the threshold voltage then an absolute measure could not be used to detect a body and therefore mitigate the problem of false detection caused by another touch sensor. This is because temperature variations and component differences cause drifts in the voltage across the sample capacitor and therefore changes in the time to reach the threshold voltage, to detect the presence of a body. This requires the measurement technique to detect the presence of a body using a change in capacitance rather than an absolute value. Furthermore the requirement for an exposed sensing electrode in order to detect the presence of a touch increases the likelihood that a false reading will be caused by another touch sensor, which may form an electrical contact between the touch sensors, such as for example where the pair of head phones touch in a user's pocket.

Various further aspects and features of the present invention are defined in the appended claims. It will be appreciated that the example embodiments described above are merely examples and the present technique finds the application in many devices and uses and is not merely associated with a touch sensor disposed on a head phone or an ear phone or detecting the presence of a body such as a finger but any effect which will change the capacitance of an electrode.

The invention claimed is:

1. An apparatus for sensing a change in capacitance of a sensing electrode to a system ground, the apparatus comprising a sample capacitor having two terminals, a first of the two terminals being coupled to the sensing electrode, a voltage measurement circuit being coupled to a second of the terminals of the sample capacitor, the voltage measurement circuit being arranged in operation to determine a voltage at the second terminal of the sample capacitor, and a voltage biasing arrangement which is arranged under the control of a controller to apply a biasing voltage or the system ground to the first terminal or the second terminal of the sample capacitor in accordance with a measurement cycle, the measurement cycle comprising grounding the first and second terminals of the sample capacitor during an initialisation part of the measurement cycle by connecting the first and second terminals to the system ground, charging the sensing electrode via the sample capacitor, during a charging part of the measurement cycle by applying a drive voltage to the second terminal of the sample capacitor, whilst floating the first terminal by not applying the system ground or a biasing voltage, and during a measurement part of the measurement cycle grounding the first terminal whilst floating the second terminal by not applying the system ground or a biasing voltage, and measuring the voltage at the second terminal, and determining whether there has been a change in capacitance of the sensing electrode in accordance with the measured voltage, wherein before or after the measurement cycle the controller is arranged to perform a sleep mode in which the sensing electrode is biased at a voltage which is greater than the system ground.

2. An apparatus as claimed in claim 1, wherein the controller is arranged to perform the sleep mode for a first predetermined time period, before performing the measurement cycle.

3. An apparatus as claimed in claim 1, wherein the controller is arranged to perform the sleep mode, if the controller determines that the apparatus has entered an in active state.

4. An apparatus as claimed in claim 3, wherein the controller is arranged to determine that the apparatus as entered the in active state if after repeating the measurement cycle there has been no change in the capacitance of the sensing electrode for a second predetermined time period.

5. An apparatus as claimed in claim 3, wherein the controller is arranged to repeat the charging part and the measuring part of the measurement cycle until the voltage measurement circuit determines that the voltage at the second terminal of the sample capacitor has reached a predetermined threshold voltage, and the controller is operable to determine whether there has been a change in the capacitance of the sensing electrode from a time taken to reach the predetermined threshold, when measured during the measurement part of the measurement cycle.

6. An apparatus as claimed in claim 5, wherein the controller is operable to determine that a change in capacitance has been caused by the presence of a body proximate the touch sensor, if the time taken to reach the predetermined threshold of less than or equal to a first predetermined value, which is less than an expected value if no body is present and to determine that an error condition has occurred corresponding to the apparatus being in the in active state if the time taken to reach the predetermined threshold exceeds a second predetermined value, which is greater than the expected value if no body is present.

7. An apparatus as claimed in claim 6, comprising an integrating filter, which is arranged to receive samples representative of values of time taken to reach the predetermined threshold voltage which are generated and to determine that a positive detection of a body proximate the touch sensor, if the time taken to reach the predetermined threshold is less than the first predetermined value for more than a predetermined number of successive samples.

8. An apparatus as claimed in claim 1, wherein the biasing arrangement include at least four switches, a first of the switches being connected to the second terminal and arranged to apply a positive biasing voltage when in a closed state and to float the second terminal in an open state, a second of the switches being connected to the second terminal and arranged to connect the second terminal to the system ground when in a closed state and to float the second terminal in an open state, a third of the switches being connected to the first terminal and arranged to apply a positive biasing voltage when in a closed state and to float the first terminal in an open state, and a fourth of the switches being connected to the first terminal and arranged to connect the first terminal to system ground when in a closed state and to float the first terminal in an open state, and during the sleep mode, the first switch, the second switch and the fourth switch are in an open state and the third switch is in the closed state.

9. A pair of audio reproducing devices comprising a first ear phone and a second ear phone, each of the first and the second ear phones including a touch sensing apparatus which is arranged to detect a body proximate a sensing electrode of the touch sensing apparatus from a change in capacitance of the sensing electrode to a system ground, the touch sensing apparatus comprising a sample capacitor having two terminals, a first of the two terminals being connected to the sensing electrode, a voltage measurement circuit connected to a second of the terminals of the sample capacitor, the voltage measurement circuit being arranged in operation to determine a voltage at the second terminal of the measurement capacitor, and a voltage biasing arrangement which is arranged under the control of a controller to apply a biasing voltage or the system ground to the first terminal or the second terminal of the sample capacitor in accordance with a measurement cycle, the measurement cycle comprising grounding the first and second terminals of the sample capacitor during an initialisation part of the measurement cycle by connecting the first and second terminals to the system ground, charging the sensing electrode via the sample capacitor, during a charging part of the measurement cycle by applying a drive voltage to the second terminal of the sample capacitor for a predetermined period, whilst floating the first terminal by not applying the system ground or a biasing voltage, and during a measurement part of the measurement cycle grounding the first terminal whilst floating the second terminal by not applying a system ground or biasing voltage, and measuring the voltage at the second terminal, and determining whether there has been a change in capacitance of the sensing electrode in accordance with the measured voltage, wherein the measurement cycle includes a sleep mode in which the sensing electrode is biased at a voltage which is greater than the system ground.

10. A method of sensing a change in capacitance of a sensing electrode to a system ground, the sensing electrode being coupled to a first terminal of a sample capacitor with a second terminal of the sample capacitor being connected to a voltage measurement circuit for determining a voltage at the second terminal of the sample capacitor, the method comprising applying the system ground to the first and second terminals of the sample capacitor during an initialisation part of the measurement cycle, charging the sensing electrode via the sample capacitor, during a charging part of the measurement cycle by applying a drive voltage to the second terminal of the sample capacitor, whilst floating the first terminal by not applying the system ground or a biasing voltage, during a measurement part of the measurement cycle applying the system ground to the first terminal whilst floating the second terminal by not applying the system ground or a biasing voltage, and measuring the voltage at the second terminal, and determining whether there has been a change in capacitance of the sensing electrode in accordance with the measured voltage, wherein the measurement cycle includes a sleep mode step, which includes biasing the sensing electrode at a voltage which is greater than the system ground.

11. A method as claimed in claim 10, wherein the sleep mode step includes biasing the sensing electrode at a voltage which is greater than the system ground, so that the sensing electrode is held high for a first predetermined time period, before performing the measurement cycle.

12. A method as claimed in claim 10, wherein the sleep mode step includes identifying an in active state, and then biasing the sensing at a voltage which is greater than the system ground, so that the sensing electrode is held high.

13. A method as claimed in claim 12, wherein the identifying the in active state comprises after repeating the measurement cycle, detecting that there has been no change in the capacitance of the sensing electrode for a second predetermined time period.

14. A method as claimed in claim 12, comprising repeating the charging part and the measuring part of the measurement cycle until the measurement part of the measurement cycle determines that the voltage at the second terminal of the sample capacitor has reached a predetermined threshold voltage, and determining whether there has been a change in the capacitance of the sensing electrode from a time taken to reach the predetermined threshold, when measured during the measurement part of the measurement cycle.

15. A method as claimed in claim 14, comprising determining that a change in capacitance has been caused by the presence of a body proximate the touch sensor, if the time taken to reach the predetermined threshold of less than or equal to a first predetermined value, which is less than an expected value if no body is present, and determining that an error condition has occurred corresponding to the apparatus being in the in active state if the time taken to reach the predetermined threshold exceeds a second predetermined value, which is greater than the expected value if no body is present.

16. A method as claimed in claim 15, comprising receiving samples representative of values of time taken to reach the predetermined threshold voltage which are generated, and determining that a positive detection of a body proximate the touch sensor, if the time taken to reach the predetermined threshold is less than the first predetermined value for more than a predetermined number of successive samples.

17. An apparatus for sensing a change in capacitance of a sensing electrode to a system ground, the sensing electrode being coupled to a first terminal of a sample capacitor with a second terminal of the sample capacitor being connected to a voltage measurement circuit for determining a voltage at the second terminal of the sample capacitor, the apparatus comprising means for applying the system ground to the first and second terminals of the sample capacitor during an initialisation part of the measurement cycle, means for charging the sensing electrode via the sample capacitor, during a charging part of the measurement cycle by applying a drive voltage to the second terminal of the sample capacitor, whilst floating the first terminal by not applying the system ground or a biasing voltage, means for applying during a measurement part of the measurement cycle the system ground to the first terminal whilst floating the second terminal by not applying the system ground or a biasing voltage, and measuring the voltage at the second terminal, means for determining whether there has been a change in capacitance of the sensing electrode in accordance with the measured voltage, and means for biasing the first terminal of the sample capacitor at a voltage which is greater than the system ground, whilst the second terminal of the sample capacitor is floated by not applying the system ground or a biasing voltage, during a sleep mode, so that the sensing electrode is held at a voltage above the system ground during the sleep mode.

18. A plurality of touch sensing devices, each of which is arranged to detect a body proximate a sensing electrode of the touch sensing device from a change in capacitance of the sensing electrode to a system ground, at least one of the plurality of touch sensing devices including a sample capacitor having two terminals, a first of the two terminals being coupled to the sensing electrode, a voltage measurement circuit coupled to a second of the terminals of the sample capacitor, the voltage measurement circuit being arranged in operation to determine a voltage at the second terminal of the measurement capacitor, and a voltage biasing arrangement which is arranged under the control of a controller to apply a biasing voltage or the system ground to the first terminal or the second terminal of the sample capacitor in accordance with a measurement cycle, the measurement cycle comprising grounding the first and second terminals of the sample capacitor during an initialisation part of the measurement cycle by coupling the first and second terminals to ground, charging the sensing electrode via the sample capacitor, during a charging part of the measurement cycle by applying a drive voltage to the second terminal of the sample capacitor, whilst floating the first terminal by not applying the system ground or a biasing voltage, and during a measurement cycle of the measurement phase grounding the first terminal whilst floating the second terminal by not applying a system ground or biasing voltage, and measuring the voltage at the second terminal, and determining whether there has been a change in capacitance of the sensing electrode in accordance with the measured voltage, wherein the measurement cycle includes a sleep mode in which the first terminal of the sample capacitor is biased at a voltage which is greater than the system ground, whilst the second terminal of the sample capacitor is floated by not applying the system ground or a biasing voltage, so that the sensing electrode is held at a voltage above the system ground during the sleep mode.

* * * * *